(12) United States Patent
Shu

(10) Patent No.: US 11,300,989 B1
(45) Date of Patent: *Apr. 12, 2022

(54) METHODS AND APPARATUS FOR TEMPERATURE INSENSITIVE VOLTAGE SUPERVISORS

(71) Applicant: Texas Instruments Incorporated, Dallas, TX (US)

(72) Inventor: Keliu Shu, Frisco, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/099,346

(22) Filed: Nov. 16, 2020

(51) Int. Cl.
  *G05F 3/26* (2006.01)
  *G05F 3/30* (2006.01)
  *H03K 17/22* (2006.01)

(52) U.S. Cl.
  CPC .............. *G05F 3/265* (2013.01); *G05F 3/267* (2013.01); *G05F 3/30* (2013.01); *H03K 17/22* (2013.01)

(58) Field of Classification Search
  None
  See application file for complete search history.

(56) References Cited

U.S. PATENT DOCUMENTS

| | | | | |
|---|---|---|---|---|
| 6,016,051 A | * | 1/2000 | Can | G05F 3/30 323/314 |
| 6,842,321 B2 | * | 1/2005 | Brohlin | H02H 3/243 361/92 |
| 7,274,250 B2 | * | 9/2007 | Hazucha | G05F 3/30 327/539 |
| 7,782,119 B2 | * | 8/2010 | Kameyama | G05F 3/227 327/513 |
| 9,587,994 B2 | * | 3/2017 | Yayama | G01K 7/01 |
| 10,345,844 B2 | * | 7/2019 | Dornseifer | G05F 3/30 |
| 10,404,054 B2 | * | 9/2019 | Huang | H02H 3/24 |
| 2007/0046341 A1 | * | 3/2007 | Tanzawa | H03K 17/14 327/143 |
| 2012/0094613 A1 | * | 4/2012 | Zhong | G05F 1/567 455/73 |

(Continued)

FOREIGN PATENT DOCUMENTS

DE  10156812  7/2003

*Primary Examiner* — Thomas J. Hiltunen
(74) *Attorney, Agent, or Firm* — Mark Allen Valetti; Charles A. Brill; Frank D. Cimino

(57) ABSTRACT

Methods, apparatus, systems and articles of manufacture are disclosed for temperature insensitive voltage supervisors. An example apparatus includes a PTAT generation circuit including an output terminal: a first resistor having a first terminal and a second terminal, a second resistor having a third terminal and a fourth terminal, the third terminal coupled to the second terminal at a first node, a first transistor including a base terminal coupled to the fourth terminal of the second resistor at a second node, and a first current terminal coupled to the fourth terminal of the second resistor, a comparator including, a first input terminal coupled to the output terminal of the PTAT generation circuit at a third node, a second input terminal coupled to the second terminal and third terminal, and a third resistor having a fifth terminal coupled to the third terminal and the second input terminal at a fourth node.

15 Claims, 5 Drawing Sheets

(56) References Cited

U.S. PATENT DOCUMENTS

2015/0168969 A1* 6/2015 Shor .................. G05F 3/30
                                                  713/340
2015/0286236 A1* 10/2015 Dornseifer ............... H03K 5/24
                                                  323/313

* cited by examiner

METHODS AND APPARATUS FOR TEMPERATURE INSENSITIVE VOLTAGE SUPERVISORS

FIELD OF THE DISCLOSURE

This disclosure relates generally to voltage supervisors, and, more particularly, to methods and apparatus for temperature insensitive voltage supervisors.

BACKGROUND

Many modern electronic systems (such as mobile phones, laptops, vehicles, televisions, gaming systems, etc.) include multiple power rails for powering electronic system components and subsystems. The multiple power rails may be configured to provide component and/or subsystem isolation or to supply, different supply voltages for different components and/or subsystems, etc. Power supply supervision in such electronic systems may involve monitoring each of the power rails to determine whether they are operating within desired voltage ranges (i.e., in-regulation). Furthermore, power supply sequencing may be required in electronic systems to ensure that the power supplies corresponding to the various power rails are enabled in a proper order. In many existing electronic systems having multiple power rails, power supply supervision is implemented as a separate system function commonly referred to as a supply voltage supervisor.

DETAILED DESCRIPTION

Figure 1:
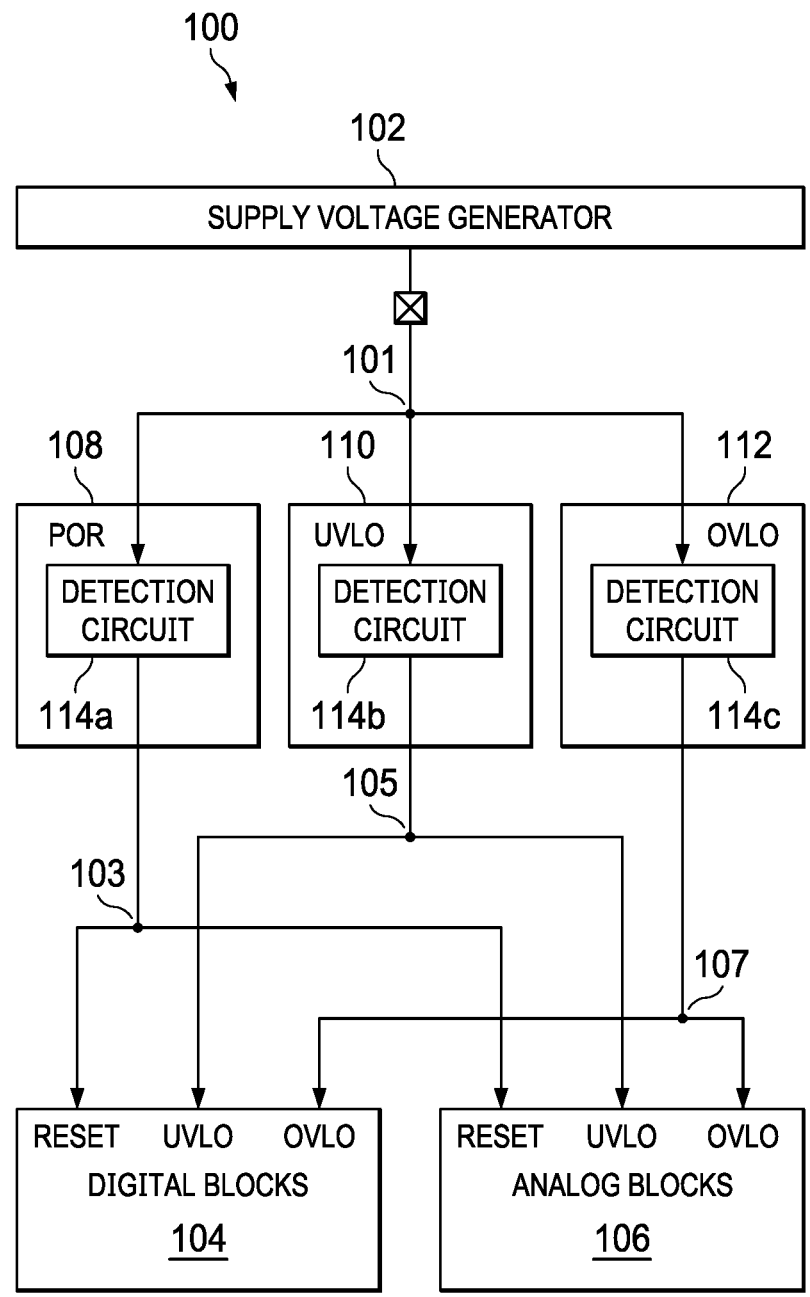
FIG. 1 is a block diagram of an example system that implements different types of voltage supervisors.

The figures are not to scale. In general, the same reference numbers will be used throughout the drawing(s) and accompanying written description to refer to the same or like parts. As used herein, references to connections (e.g., attached, coupled, connected, and joined) are to be construed in light of the specification and, when pertinent, the surrounding claim language. Construction of connection references in the present application shall be consistent with the claim language and the context of the specification which describes the purpose for which various elements are connected. As such, connection references do not necessarily infer that two elements are directly connected and in fixed relation to each other.

Descriptors first, second, third, etc., are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

Power on reset (POR) devices and under/over voltage lock out (UVLO/OVLO) devices are devices (e.g., systems) that implement supply voltage supervision. A POR device generates resetting signals whenever the supply voltage reaches a certain threshold required by a device intended to receive the supply voltage (e.g., a subsystem). In some examples, POR devices are utilized by logic control circuits in digital and analog subsystems of an electronic device. A UVLO device shuts down (e.g., turns off) the device (such as, DC-DC converter, power switch, amplifier, central processing unit (CPU), accelerator, etc.) intended to receive the supply voltage when the supply voltage drops below a certain threshold voltage. An OVLO devices shuts down (e.g., turns off) the device (such as, DC-DC converter, power switch, amplifier, central processing unit (CPU), accelerator, etc.) intended to receive the supply voltage when the supply voltage rises above a certain threshold voltage.

A common factor required by all three voltage supervision aspects described above is threshold voltage. The threshold voltage is an important factor in voltage supervision because the accuracy of the threshold voltage can greatly impact the operation of the device intended to receive the supply voltage. For example, a UVLO device is fabricated for monitoring supply voltage to a DC-DC converter, where 1.8 volts of supply voltage is used for operation of the DC-DC converter. In such an example, if the UVLO device has a threshold voltage that ranges from 1.7 volts to 1.8 volts, the UVLO device may fail to shut down the DC-DC converter when the supply voltage drops below 1.8 volts because the threshold voltage is 1.7 volts. Failing to shut down the DC-DC converter can cause physical damage to the components within device, function failure, performance loss, etc., which are all undesirable. Therefore, devices implementing voltage supervision are designed to produce accurate (e.g., less than 5% tolerance) and precise threshold voltages (e.g., a range between 0.8 volts and 1.2 volts) for comparison to supply voltages.

In some examples, temperature, process, and component variations may affect the precision and/or accuracy of the threshold voltages implemented and/or generated by the voltage supervisors. In some conventional voltage supervisors, a bandgap reference is utilized to minimize and/or eliminate temperature dependent threshold voltages. A bandgap reference is a temperature independent voltage reference circuit that generates a fixed voltage regardless of power supply variations, temperature changes, and circuit loading. However, bandgap references may add undesired complexity, latency, and extra costs to the voltage supervisors.

Therefore, some voltage supervisors do not use bandgap references. In some examples, the voltage supervisor includes a comparator that compares two voltages generated by a resistor pair, responsive to a supply voltage. When the two voltages are equal, the comparator toggles. In examples disclosed herein, a toggling point of the comparator can be referred to as the threshold voltage. For example, when the supply voltage meets the threshold voltage, the comparator toggles. In these recent voltage supervisors, the threshold voltage may be subject to variation (e.g., may change) depending on the value of the temperature of the resistors and other components used to design the voltage supervisor.

In some examples, the threshold voltage is temperature insensitive when a difference in up-scaled base to emitter voltage (ΔVbe) between two transistors (e.g., a difference in base to emitter voltage that is increased based on the size of the resistor pair) and the base to emitter voltage (Vbe) of one of the transistors cancel out. However, the threshold voltage will be temperature dependent when the temperature coefficients of two voltages do not cancel. For example, at voltages greater than a bandgap voltage (e.g., 1.2 volts, an industry standard), the base to emitter voltage, Vbe, may have a negative temperature coefficient that does not match the positive temperature coefficient of the up-scaled difference in base to emitter voltage between two transistors. In some examples, the two voltages (up-scaled ΔVbe and Vbe) only cancel when the threshold value is equal to the bandgap voltage (e.g., approximately 1.2 volts). Therefore, in recent voltage supervisors, if the threshold voltage is above or below the bandgap voltage, the threshold voltage may be subject to variation when temperature increases and/or decreases from room temperature (e.g., normal operating temperature). For example, when the threshold voltage is above the bandgap voltage of the circuit, there is a positive temperature coefficient (e.g., threshold voltage increases when temperature increases) and when the threshold voltage is below the bandgap voltage, there is a negative temperature coefficient (e.g., the threshold voltage decreases when temperature increases). The more that the threshold voltage deviates from the bandgap, the larger the temperature coefficient.

Examples disclosed herein include a detection circuit, implemented by a voltage supervisor, that can generate a temperature insensitive threshold voltage below the bandgap voltage. Examples disclosed herein solve the problem of when the threshold voltage of the voltage supervisor is below the bandgap voltage (e.g., 1.2 volts) and the circuit is subject to temperatures greater than or less than room temperature. In examples disclosed herein, if the voltage supervisor is required to toggle and/or trip (e.g., providing an output indicative of the supply voltage) at a voltage that is below the bandgap voltage, then the described approach could do so. The detection circuit disclosed herein causes the voltage supervisor to toggle at a threshold voltage that is lower than the bandgap voltage and includes a very low temperature coefficient (e.g., a temperature coefficient with a temperature variation less than ±1% over −40° C. to 125° C.). The example detection circuit includes a proportional to absolute temperature (PTAT) current generation circuit that generates a low-voltage PTAT current (e.g., a PTAT current compatible with low-voltage supply). In examples disclosed herein, the generation of a low-voltage PTAT current is the proper generation of PTAT current when the supply voltage is low, such as when the supply voltage less than the detection voltage. In examples disclosed herein, the PTAT current is configured to be coupled to a scaling portion of the detection circuit through a low-voltage comparator. In examples disclosed herein, the toggling point of the low-voltage comparator corresponds to a temperature-insensitive supply voltage threshold that is less than the bandgap voltage.

FIG. 1 is a block diagram of an example system 100 that implements different types of voltage supervisors. The example system 100 includes an example supply voltage generator 102, example digital blocks 104, example analog blocks 106, an example first voltage supervisor 108, an example second voltage supervisor 110, and an example third voltage supervisor 112. In the example of FIG. 1, the first voltage supervisor 108 is a power-on reset (POR) circuit, the second voltage supervisor 110 is an under voltage lockout (UVLO) circuit, and the third voltage supervisor is an over voltage lockout (OVLO) circuit.

The system 100 may be any type of power operated device, such as a computer, a telephone, a television, a smart watch, etc. The system 100 is powered by the supply voltage generator 102 (which may include a battery, direct current (DC) power supply and/or a regulator, such as a low drop-out (LDO), buck, boost, or buck-boost regulator). The supply voltage generator 102 is configured and/or adapted to provide adequate power supply to the digital blocks 104 and the analog blocks 106 of the system 100. For example, the supply voltage generator 102 turns the digital blocks 104 and the analog blocks 106 on and off, responsive to a control signal. In some examples, the supply voltage generator 102 is any type of power supply generator, such as a battery. In some examples, the supply voltage generator outputs a low-voltage supply relative to a standard supply voltage output.

The digital blocks 104 and the analog blocks 106 perform and/or execute operations for the system 100. For example, the digital blocks 104 and the analog blocks 106 include a central processing unit (CPU) core and mixed signal arrays of configurable integrated analog and digital peripherals that make up a system on a chip (SoC). An SoC is an integrated circuit that integrates all or most components of a computer or other electronic system. In some examples, the digital blocks 104 are state machines, such as logic gates, flip-flops, microcontrollers, microprocessors, etc. In some examples, the analog blocks 106 are electrical components such as amplifiers, power switches, etc. The digital blocks 104 and the analog blocks 106 are configured to receive supply voltage from the supply voltage generator 102. In some examples, the digital blocks 104 operate at specific specifications, such as a range of voltages (e.g., minimum and maximum supply voltage requirements), temperatures, etc. In some examples, the analog blocks 106 operate at specific specifications, different or the same as the digital blocks 104, such as a range of voltages, temperatures, etc. Due to the specific specifications and requirements of the digital blocks 104 and analog blocks 106, the system 100 includes the voltage supervisors 108, 110, and 112. While voltage supervisors 108, 110 and 112 are depicted as three separate circuit blocks in FIG. 1, in some example embodiment these voltage supervisors may be implemented in fewer (e.g. one) or more circuit blocks or they may be included in supply voltage generator 102.

The first voltage supervisor 108 is a POR circuit that generates reset signals whenever power is supplied to a given electrical device (e.g., the digital blocks 104 and/or the analog blocks 106). For example, the POR circuit is a circuit that provides a predictable, regulated voltage to the digital blocks 104 and the analog blocks 106 with the initial application of power. The first voltage supervisor 108 detects the level of supply voltage output by the supply voltage generator 102 and trips (e.g., toggles) when the supply voltage exceeds a threshold voltage (Vth).

The first voltage supervisor 108 includes an input terminal and an output terminal. The input terminal of the first voltage supervisor 108 is coupled to an output terminal of the supply voltage generator 102 at a first node 101. The output terminal of the first voltage supervisor 108 is coupled to a first reset terminal of the digital blocks 104 and a second reset terminal of the analog blocks at a second node 103.

The second voltage supervisor 110 is a UVLO circuit that turns off the power of an electronic device (e.g., the digital blocks 104 and/or the analog blocks 106) responsive to the supply voltage decreasing below an operational value. The second voltage supervisor 110 detects the level of supply voltage output by the supply voltage generator 102 and trips (e.g., toggles) when the supply voltage decreases below a threshold voltage (Vth).

The second voltage supervisor 110 includes an input terminal and an output terminal. The input terminal of the second voltage supervisor 110 is coupled to the output terminal of the supply voltage generator 102 at the first node 101. The output terminal of the second voltage supervisor 110 is coupled to a first UVLO terminal of the digital blocks 104 and a second UVLO terminal of the analog blocks at a third node 105.

The third voltage supervisor 112 is an OVLO circuit that turns off the power of an electronic device (e.g., the digital blocks 104 and/or the analog blocks 106) responsive to the supply voltage increasing above an operational value. The third voltage supervisor 112 detects the level of supply voltage output by the supply voltage generator 102 and trips (e.g., toggles) when the supply voltage increases above a threshold voltage (Vth).

The third voltage supervisor 112 includes an input terminal and an output terminal. The input terminal of the third voltage supervisor 112 is coupled to the output terminal of the supply voltage generator 102 at the first node 101. The output terminal of the third voltage supervisor 112 is coupled to a first OVLO terminal of the digital blocks 104 and a second OVLO terminal of the analog blocks at a fourth node 107.

The example voltage supervisors 108, 110, and 112 include example detection circuits 114a, 114b, and 114c. The detection circuits 114a, 114b, and 114c compare two voltages generated from the supply voltage to detect the supply threshold voltage which is insensitive to temperature drift. The detection circuits 114a, 114b, and 114c accurately trigger (e.g., toggle the output voltage of the voltage supervisor) at the desired supply threshold voltage of the voltage supervisors 108, 110, 112 regardless of temperature, wherein the desired supply threshold voltage is determined based on the purpose of each voltage supervisor 108, 110, 112. For example, a first detection circuit 114a, implemented by the first voltage supervisor 108, triggers at a desired power-on-reset threshold voltage (Vth). In other examples, a second detection circuit 114b implemented by the second voltage supervisor 110 triggers at a desired under voltage lock out threshold (Vth). In other examples, a third detection circuit 114c implemented by the third voltage supervisor 110 triggers at a desired over voltage lock out threshold (Vth). In each example, the detection circuits 114a, 114b, and 114c operate to manage temperature variation that can occur in the system 100, as described in further detail below in connection with FIG. 2.

The digital blocks 104 and the analog blocks 106 respond to signals at the respective reset, UVLO, and OVLO terminals. For example, the digital blocks 104 power down when the second voltage supervisor 110 (e.g., the detection circuit 114b) trips due to a decrease of supply voltage below the threshold voltage. In other examples, the analog blocks 106 power on responsive to the first voltage supervisor 108 (e.g., the detection circuit 114a) tripping due to a supply voltage meeting the threshold voltage. In examples disclosed herein, the first, second, and third voltage supervisors 108, 110, 112 protect the digital blocks 104 and analog blocks 106 from functional failure, performance loss, and device damage, etc., caused by the supply voltage being too low or too high. In some examples, the device 100 includes more than one first voltage supervisor 108 (e.g., POR circuit), more than one second voltage supervisor 110 (e.g., UVLO circuit), and/or more than one third voltage supervisor 112 (e.g., OVLO circuit). For example, the digital blocks 104 can include numerous types of state machines, where each state machine requires different specifications (e.g., different supply/operational voltages). In other examples, the analog blocks 106 can include numerous types of analog electrical components, where each component requires different specifications (e.g., different supply/operational voltages).

In examples disclosed herein, one or more of the digital blocks 104 operates at a supply voltage that is less than a bandgap voltage (e.g., 1.2 volts). In examples disclosed herein, one or more of the analog blocks 106 operates at a supply voltage that is less than the bandgap voltage. In examples disclosed herein, the detection circuits 114a, 114b, 114c and/or more generally, the voltage supervisors 108, 110, and 112, generate a down-scaled version of the bandgap voltage that is used as the threshold voltage. In this manner, the detection circuits 114a, 114b, and 114c generate a temperature insensitive threshold voltage that is reliable in temperature change conditions. An implementation of such detection circuits 114a, 114b, and 114c is described in further detail below in connection with FIG. 2.

Figure 2:
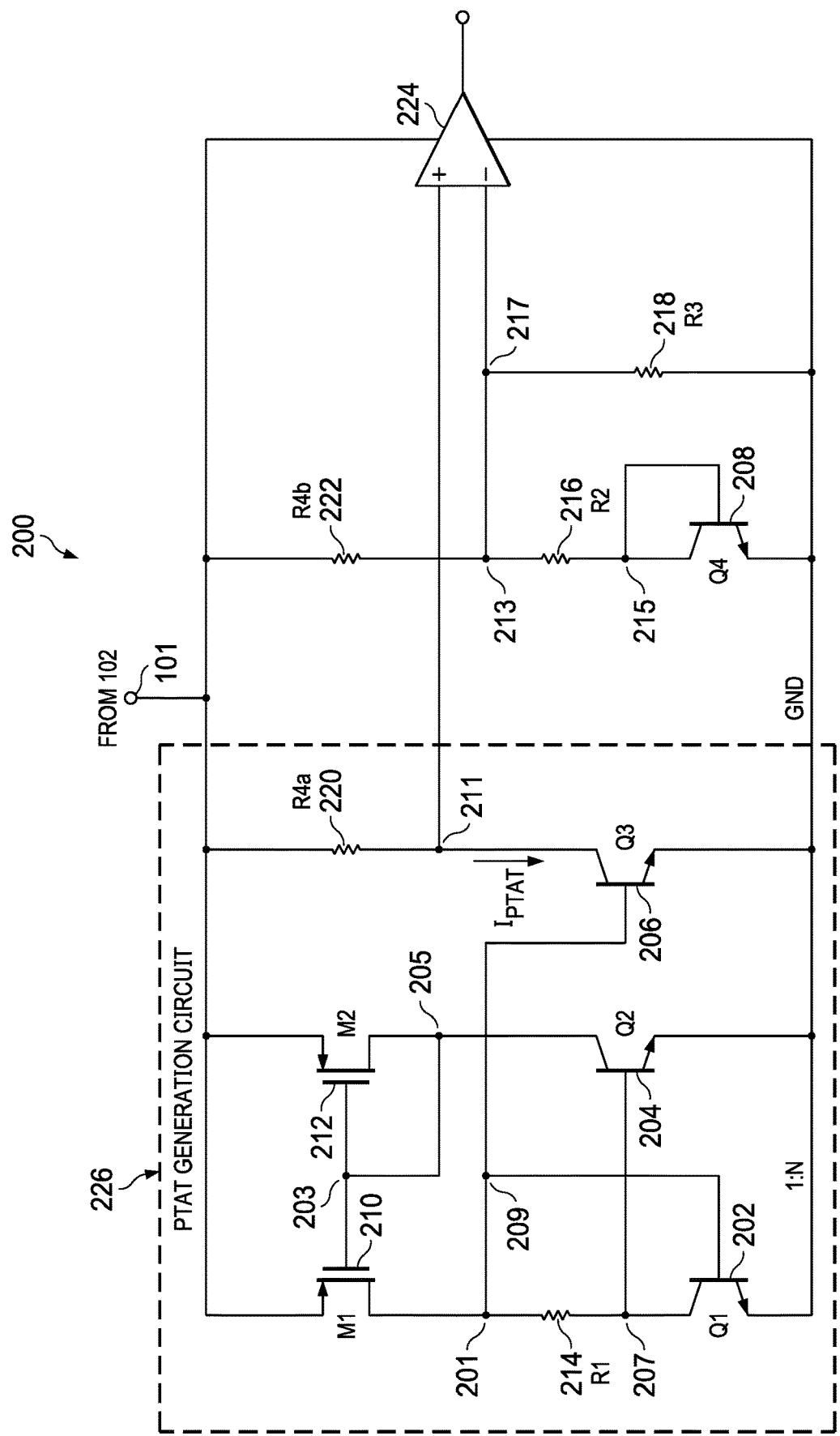
FIG. 2 is a schematic illustration of an example detection circuit that may be implemented by the different types of voltage supervisors of FIG. 1 to monitor supply voltage.

FIG. 2 is a schematic illustration of an example detection circuit 200 to monitor supply voltage. The detection circuit 200 may be implemented by the first detection circuit 114a of the example first voltage supervisor 108 (POR circuit), the second detection circuit 114b of the example second voltage supervisor 110 (UVLO circuit), and/or the third detection circuit 114c of the example third voltage supervisor 112 (OVLO circuit) of FIG. 1. In some examples, the detection circuit 200 monitors supply voltage output by the supply voltage generator 102 of FIG. 1. The detection circuit 200 includes an example first transistor (Q1) 202, an example second transistor (Q2) 204, an example third transistor (Q3) 206, an example fourth transistor (Q4) 208, an example first switch (M1) 210, an example second switch (M2) 212, an example first resistor (R1) 214, an example second resistor (R2) 216, an example third resistor (R3) 218, an example fourth resistor (R4a) 220, an example fifth resistor (R4b) 222, and an example comparator 224. The first transistor 202, the second transistor 204, the third transistor 206, the first switch 210, the second switch 212, the first resistor 214, and the fourth resistor 220 make up an example PTAT generation circuit 226.

The first transistor 202, the second transistor 204, the third transistor 206, and fourth transistor 208 are implemented by NPN bipolar junction transistors (BJTs). Alternatively, the first transistor 202, the second transistor 204, the third transistor 206, and fourth transistor 208 may be implemented by a different type of transistor, such a PNP BJT, a junction gate field-effect transistor (JFET), a metal-oxide-semiconductor field-effect transistors (MOSFETs), etc. The first switch 210 and the second switch 212 are implemented by P-channel metal-oxide-semiconductor field-effect transistors (MOSFETs) (e.g., P-channel silicon MOSFETs, P-channel gallium nitride (GaN) MOSFETs, etc.). Alternatively, the first switch 210 and the second switch 212 may be implemented by a different type of transistor, such as a bipolar junction transistor (BJT), an N-channel MOSFET, a junction gate field-effect transistor (JFET), etc.

The second transistor 204 is N times the size of the first transistor 202. For example, the first transistor 202 is copied N times to make up second transistor 204. As used herein, N is indicative of a size ratio that indicates the difference in area between the first transistor 202 and second transistor 204. The size ratio of the transistors 202, 204 and/or the size of the second transistor 204 is selected based on device matching and the area of a chip on which the detection circuit 200 is designed.

A first current terminal (e.g., a source terminal) of the first switch 210 is configured and/or adapted to be coupled to the output terminal of the supply voltage generator 102 (FIG. 1) at the first node 101. A second current terminal (e.g., a drain terminal) of the first switch 210 is coupled to a first terminal of the first resistor (R1) 214 at a fifth node 201. A gate terminal of the first switch 210 is coupled to a gate terminal of the second switch 212 at a sixth node 203. A first current terminal (e.g., a source terminal) of the second switch 212 is configured and/or adapted to be coupled to the output terminal of the supply voltage generator 102 (FIG. 1) at the first node 101. A second current terminal (e.g., a drain terminal) of the second switch 212 is coupled to a first current terminal (e.g., a collector terminal) of the second transistor (Q2) 204 at a seventh node 205.

A base terminal of the second transistor (Q2) 204 is coupled to a second terminal of the first resistor (R1) 214 at an eighth node 207. A first current terminal (e.g., a collector terminal) of the first transistor (Q1) 202 is coupled to the second terminal of the first resistor (R1) 214 at the eighth node 207. Consequently, the base terminal of the second transistor (Q2) 204 is coupled to the first current terminal (e.g., the collector terminal) of the first transistor (Q1) 202 at the eighth node 207. A base terminal of the first transistor (Q1) 202 is coupled to a base terminal of the third transistor (Q3) 206 at a ninth node 209 and coupled to the second current terminal (e.g., drain terminal) of the first switch (M1) 210 at the ninth node 209. The base terminal of the third switch (Q3) 206 is coupled to the second current terminal (e.g., drain terminal) of the first switch (M1) 210 at the fifth node 201 and the first terminal of the first resistor (R1) 214 at the fifth node 201. A first current terminal (e.g., collector terminal) of the third transistor (Q3) 206 is coupled to a second terminal of the fourth resistor (R4a) 220 at a tenth node 211. A first terminal of the fourth resistor (R4a) 220 is configured and/or adapted to be coupled to the output terminal of the supply voltage generator 102 (FIG. 1) at the first node 101.

A first terminal of the fifth resistor (R4b) 222 is configured and/or adapted to be coupled to the output terminal of the supply voltage generator 102 (FIG. 1) at the first node 101. A second terminal of the fifth resistor (R4b) 222 is coupled to a first terminal of the second resistor (R2) 216 at an eleventh node 213. A second terminal of the second resistor (R2) 216 is coupled to a first current terminal (e.g., collector terminal) of the fourth transistor (Q4) 208 at a twelfth node 215. A base terminal of the fourth transistor (Q4) 208 is coupled to the first current terminal (e.g., collector terminal) of the fourth transistor (Q4) 208 at the twelfth node 215 and coupled to the second terminal of the second resistor (R2) 216 at the twelfth node 215.

A non-inverting input terminal of the comparator 224 is coupled to the first current terminal (e.g., collector terminal) of the third transistor (Q3) 206 at the tenth node 211 and coupled to the second terminal of the fourth resistor (R4a) 220 at the tenth node 211. An inverting input terminal of the comparator 224 is coupled between the second terminal of the fifth resistor (R4b) 222 and the first terminal of the second resistor (R2) 216 at the eleventh node 213. Additionally, the inverting input terminal of the comparator 224 is coupled to a first terminal of the third resistor (R3) 218 at a thirteenth node 217. In the example embodiment of FIG. 2, the positive supply rail of comparator 224 is connected to node 101 and the negative supply rail is connected to ground (GND).

In the topology of the FIG. 2, the detection circuit 200 includes the PTAT generation circuit 226 to generate a PTAT current ($I_{PTAT}$). The PTAT generation circuit 226 does not require frequency compensation for current generation and, thus, is very wide-band. Therefore, the PTAT generation circuit 226 can respond quickly to fast changes of supply voltage. The PTAT current is configured to generate a constant current through the fourth resistor (R4a) 220 such that the voltage drop across the fourth resistor (R4a) 220 only changes with temperature. The PTAT generation circuit 226 includes the first switch (M1) 210 and the second switch (M2) 212 to make up a current mirror for assisting in generation of PTAT current ($I_{PTAT}$). The current mirror causes the current at the fifth node 201 and the current at the seventh node 205 to be equal (where the transistor width/length ratios of transistors M1 and M2 are the same) or to be a certain ratio (based on the transistor width/length ratios of transistors M1 and M2). The PTAT generation circuit 226 includes the third transistor (Q3) 206 to mirror the current of the fifth node 201 at the tenth node 211. The PTAT generation circuit 226 includes the first transistor (Q1) 202 and the second transistor (Q2) 204 to generate the PTAT current utilizing the applied current from the current mirror.

The PTAT current can be derived from the first transistor (Q1) 202, the second transistor (Q2) 204, and the first resistor (R1) 214. For example, amplifying the difference in base to emitter voltage ($V_{be}$) of two transistors (e.g., BJTs) generates PTAT current. To obtain different base to emitter voltages, a circuit (e.g., the detection circuit 200) can apply different currents to the collector terminals of the transistors or a circuit (e.g., the detection circuit 200) can include two transistors with different emitter areas but equal collector currents. In the example of FIG. 2, a second current terminal (e.g., emitter terminal) of the first transistor (Q1) 202 has a different size than a second current terminal of the second transistor (Q2) 204 and the respective first current terminals (e.g., collector terminals) of the first transistor 202 and second transistor 204 obtain approximately equal currents from the current mirror at the fifth node 201 and seventh node 205. In some examples, the PTAT current can be determined by utilizing Equation 1 below. In Equation 1, $\Delta V_{be}$ is the difference in base to emitter voltage of the first transistor 202 and base to emitter voltage of the second transistor 204 and R1 is the resistance value of the first resistor 214.

$$I_{PTAT} = \frac{\Delta V_{be}}{R1} \qquad \text{Equation 1}$$

In some examples, the difference in the base to emitter voltages of the first transistor 202 and the second transistor 204 is the voltage drop across the first resistor (R1) 214. For example, because the base terminal of the first transistor 202 is coupled to the first terminal of the first resistor 214 at the ninth node 209 and because the base terminal of the second transistor 204 is coupled to the second terminal of the first resistor 214 at the eighth node 207, the difference between the two voltages at the ninth node 209 and the eighth node 207 is equal to the voltage drop across the first resistor 214. In other examples, the difference in base to emitter voltage of the first transistor 202 and the second transistor 204 can be partially determined based on the thermal voltage (e.g., thermal characteristics) of the transistors 202, 204. For example, $\Delta V_{be}$ can be determined utilizing Equation 2 below. In Equation 2, $V_T$ is indicative of the thermal voltage of the two transistors 202, 204 and ln(N) is the natural log of the size ratio of the two transistors 202, 204.

$$\Delta V_{be} = V_T * \ln(N) \qquad \text{Equation 2}$$

The thermal voltage ($V_T$) of the two transistors 202, 204 depends on the absolute temperature (T) of the detection circuit 200 in degrees Kelvin. For example, the thermal voltage ($V_T$) can be defined by utilizing Equation 3 below. In Equation 3 below, T is absolute temperature of the first transistor 202 and second transistor 204, k is Boltzmann's constant, and q is the elementary charge (e.g., a constant).

$$V_T = \frac{k*T}{q} \qquad \text{Equation 3}$$

The PTAT current ($I_{PTAT}$) is mirrored into the fourth resistor (R4a) 220 via the third transistor (Q3) 206. The voltage at the tenth node 211 is equal to the difference between the supply voltage at the first node 101 and the voltage drop across the fourth resistor (R4a) 220. The voltage drop across the fourth resistor (R4a) 220 is equal to the PTAT current ($I_{PTAT}$) times the resistance of R4a 220. Because the PTAT current only changes with temperature, the voltage drop across the fourth resistor 220 is insensitive to changes in supply voltage. At a certain range of temperature, the voltage drop across the fourth resistor 220 remains constant.

The detection circuit 200 includes the fifth resistor (R4b) 222, the second resistor (R2) 216, the third resistor (R3) 218, and the fourth transistor (Q4) to generate a second voltage at the eleventh node 213 that causes the comparator 224 to toggle at a threshold value (e.g., a threshold level of supply voltage). The second voltage at the eleventh node 213 changes with the supply voltage at the first node 101. For example, the second voltage at the eleventh node 113 increases and/or decreases responsive to the supply voltage at the first node 101 increasing and/or decreasing. In examples disclosed herein, the detection circuit 200 is configured to toggle (e.g., change output) when the supply voltage at the first node 101 meets a threshold value that is less than the bandgap voltage. The detection circuit 200 achieves the toggling point (e.g., the point at which the signal at the tenth node 211 is equal to the signal at the eleventh node 213) based on the configuration of the PTAT generation circuit 226 and the fifth resistor (R4b) 222, the second resistor (R2) 216, the third resistor (R3) 218, and the fourth transistor (Q4).

In some example embodiments, the fifth resistor (R4b) 222 is the same as the fourth resistor (R4a) 220. At the toggling point, the current through the fifth resistor (R4b) 222 is equal to the current (e.g., $I_{PTAT}$) through the fourth resistor (R4a) 220 because the two resistors have the same resistance. In some examples, the fourth resistor 220 and the fifth resistor 222 are a specific ratio (r), such a 1:2, 1:3, etc. The fourth and fifth resistors 220, 222 are of equal or proportional resistance to have equal or proportional current ($I_{PTAT}$) at the toggling point of the comparator 224. Therefore, if the fifth resistor (R4b) 222 is twice the size of the fourth resistor (R4a) 220, the current ($I_{PTAT}$) is scaled down by a factor of two.

The second resistor (R2) 216 and the third resistor (R3) 218 have specific values that are determined based on the desired toggling point (e.g., threshold level of supply voltage) of the detection circuit 200. For example, the second and third resistors 216, 218 are utilized as a ratio (r) that scales down the supply voltage detection threshold at the first node 101 from the bandgap voltage to a desired voltage level. For example, the ratio (r) is less than one, due to the design values selected for the second and third resistors 216, 218 and, thus, scales down (e.g., decreases) the voltage at the eleventh node 213. In some examples, the ratio (r) can be determined utilizing Equation 4 below. In Equation 4 below, r is indicative of the ratio of the second and third resistors 216, 218.

$$r = \frac{R3}{R2 + R3} \qquad \text{Equation 4}$$

In some embodiments where the output of detection circuit 200 indicates that the supply voltage is approximately equal to the threshold voltage, the signal at the tenth node 211 is to equal the signal at the eleventh node 213. When the signals at the tenth node 211 and the eleventh node 213 equal, the current across the fourth resistor (R4a) 220 and the current across the fifth resistor (R4b) 222 are equal. The current across the fifth resistor (R4b) 222 at the toggling point can be determined by utilizing Equation 5 below, where the fourth resistor (R4a) 220 is equal to the fifth resistor (R4b) 222 and therefore, the fourth and fifth resistors 220, 222 are referred to as R4. In Equation 5, $I_{R4b}$ is the current across the fifth resistor (R4b) 222, $V_{dd\_th}$ is the supply threshold voltage (e.g., the threshold level of voltage at which the comparator 224 toggles), $\Delta V_{be}$ is the difference in base to emitter voltage between the first transistor (Q1) 202 and the second transistor (Q2) 204, and $V_{be4}$ is the base to emitter voltage of the fourth transistor (Q4) 208.

$$I_{R4b} = \left(\frac{V_{dd_{th}} - \left(\frac{\Delta V_{be}}{R1}\right)*R4}{R3}\right) + \left(\frac{V_{dd_{th}} - \left(\frac{\Delta V_{be}}{R1}\right)*R4 - V_{be4}}{R2}\right) \qquad \text{Equation 5}$$

Based on the above information, the threshold level of supply voltage can be derived. In some examples, the threshold level of supply voltage can be derived based on setting the current across the fourth resistor 220 equal to the current across the fifth resistor 222 and solving for the supply threshold voltage ($V_{dd\_th}$). For example, the supply threshold voltage ($V_{dd\_th}$) can be determined by utilizing Equation 6 below.

$$V_{dd_{th}} = \left(\frac{R3}{(R2+R1)}\right) * \left[\frac{R1}{R2} * \left(1 + \left(\frac{R4}{\frac{R2*R3}{R2+R3}}\right)\right) * \Delta V_{be} + V_{be4}\right] \qquad \text{Equation 6}$$

In some examples, the supply threshold voltage ($V_{dd\_th}$) can be simplified. For example, the supply threshold voltage ($V_{dd\_th}$) can be simplified to the bandgap voltage ($V_{BG}$) times the ratio (r). In examples disclosed herein, it can be assumed that the bandgap voltage ($V_{BG}$) of the detection circuit 200 is equal to the difference in base to up-scaled emitter voltage between the first transistor (Q1) 202 and the second transistor (Q2) 204 ($\Delta V_{be}$) summed with the base to emitter voltage of the fourth transistor (Q4) ($V_{be4}$). In examples disclosed herein, the voltage at the eleventh node 213 is scaled down by ratio (r), where ratio (r) is based on the second and third resistors 216, 218 (e.g., illustrated in Equation 4 above). Therefore, the supply threshold voltage ($V_{dd\_th}$) (e.g. the voltage at the first node 101 that causes the comparator 224 to toggle) is a scaled down bandgap voltage ($V_{BG}$) based on the ratio (r). As such, the supply threshold voltage ($V_{dd\_th}$) can be determined utilizing Equation 7 below, where the bandgap voltage $V_{BG}$ is equal to $m*\Delta V_{be}+ V_{be4}$, and scaling factor (m) is equal to $$\frac{R_2}{R_1}\left(1 + \frac{R4}{\frac{R2*R3}{R2+R3}}\right).$$

$$V_{dd\_th} = V_{BG}*r \quad \text{Equation 7}$$

As illustrated in Equation 7 above, the detection circuit 200 achieves supply voltage threshold that is below the bandgap voltage but also temperature insensitive. Therefore, the detection circuit 200 accurately detects the supply voltage at the first node 101 during temperature variation. In this manner, the receiving devices (e.g., the digital blocks 104 and/or the analog block 106 of FIG. 1) operate with proper supply voltage based on the accuracy of the detection circuit 200.

An example operation of the detection circuit 200 is described below. The detection circuit 200 is to toggle when the signal (e.g., voltage) at the first node 101 meets a threshold level of voltage. In examples disclosed herein, the threshold level of voltage is below the industry standard bandgap voltage ($V_{BG}$) of 1.2 volts. As an example of operation (for purposes of explanation), the comparator 224 is configured to toggle when the supply voltage at the first node 101 is 0.9 volts. However, the threshold level of voltage can be any value less than the bandgap voltage ($V_{BG}$).

Continuing with this example, at a first time, the signal at the first node 101 charges responsive to the supply voltage generator 102 supplying an output. At the first time, the output signal at the first node 101 is less than the example threshold level of voltage. The current mirror made up of the first switch (M1) 210 and the second switch (M2) 212 turn on responsive to the charging signal at the first node 101. The first switch (M1) 210 and the second switch (M2) 212 output equal and/or proportional currents across their respective current terminals (e.g., drain terminals) responsive to turning on. The first transistor (Q1) 202 and the second transistor (Q2) 204 turn on responsive to the output current from the first switch 210 and second switch 212 at the respective base terminals of the first transistor (Q1) 202 and the second transistor (Q2) 204. The first transistor (Q1) 202 and the second transistor (Q2) 204 generate a PTAT current at the fifth node 201. The third transistor (Q3) 206 mirrors the PTAT current of the fifth node 201 at the tenth node 211. In this manner, the current conducting through the fourth resistor (R4a) 220 is equal to the PTAT current. Therefore, the fourth resistor (R4a) 220 drops a constant voltage corresponding to the voltage at the first node 101 and the resistance of the fourth resistor 220 and the PTAT current.

Simultaneously, at the first time, the signal at the eleventh node 213 changes responsive to the signal at the first node 101 charging. For example, the signal at the eleventh node 213 increases when the signal at the first node 101 increases. In some examples, the signal at the eleventh node 213 is greater than the signal at the tenth node 211 at the first time. Therefore, the comparator 224 does not toggle at the first time. In some examples, at the first time, the comparator 224 outputs a logic zero because the signal at the inverting input is greater than the signal at the non-inverting input.

At a second time, the signal at the first node 101 charges to the threshold level of voltage. In this example, the threshold level of voltage, and, thus, the signal of the first node 101 at the second time, is 0.9 V. The PTAT generation circuit 226 generates the PTAT current in a consistent manner, such that when a sufficient voltage is applied to the PTAT generation circuit 226, the current flowing through the collector terminal of the third transistor 206 (e.g., output of the PTAT generation circuit 226) is constant. The current through the fourth resistor 220 is approximately equal to the current flowing through the collector terminal of the third transistor 206. The signal at the tenth node 211 increases responsive to the signal at the first node 101 increasing.

At the threshold level of voltage (e.g., 900 millivolts), the current through the fourth resistor 220 is approximately equal to the current through the fifth resistor 222. Therefore, the voltage drops across the fourth and fifth resistors 220, 222 are approximately equal. In this manner, the signal at the eleventh node 213 increases to the same level as the signal at the tenth node 211, responsive to the signal at the first node 101 increasing to the threshold level of voltage.

The comparator 224 toggles at the second time responsive to the signal at the tenth node 211 and the signal at the eleventh node 213 equal to each other. In some examples, the comparator 224 outputs a logic high responsive to the equal inputs at the inverting and non-inverting terminals. In some examples, the output of the comparator 224 follows the signal at the first node 101. For example, when 900 millivolts output at the first node 101, the comparator 224 outputs 900 millivolts. In other examples, when 1.5 volts is output at the first node 101, the comparator 224 outputs 1.5 volts. However, in other example embodiments, where the positive and negative supply rails of comparator 224 are connected to other supply sources, the output of comparator 224 may be greater than or less than the voltage at first node 101.

Figure 3:
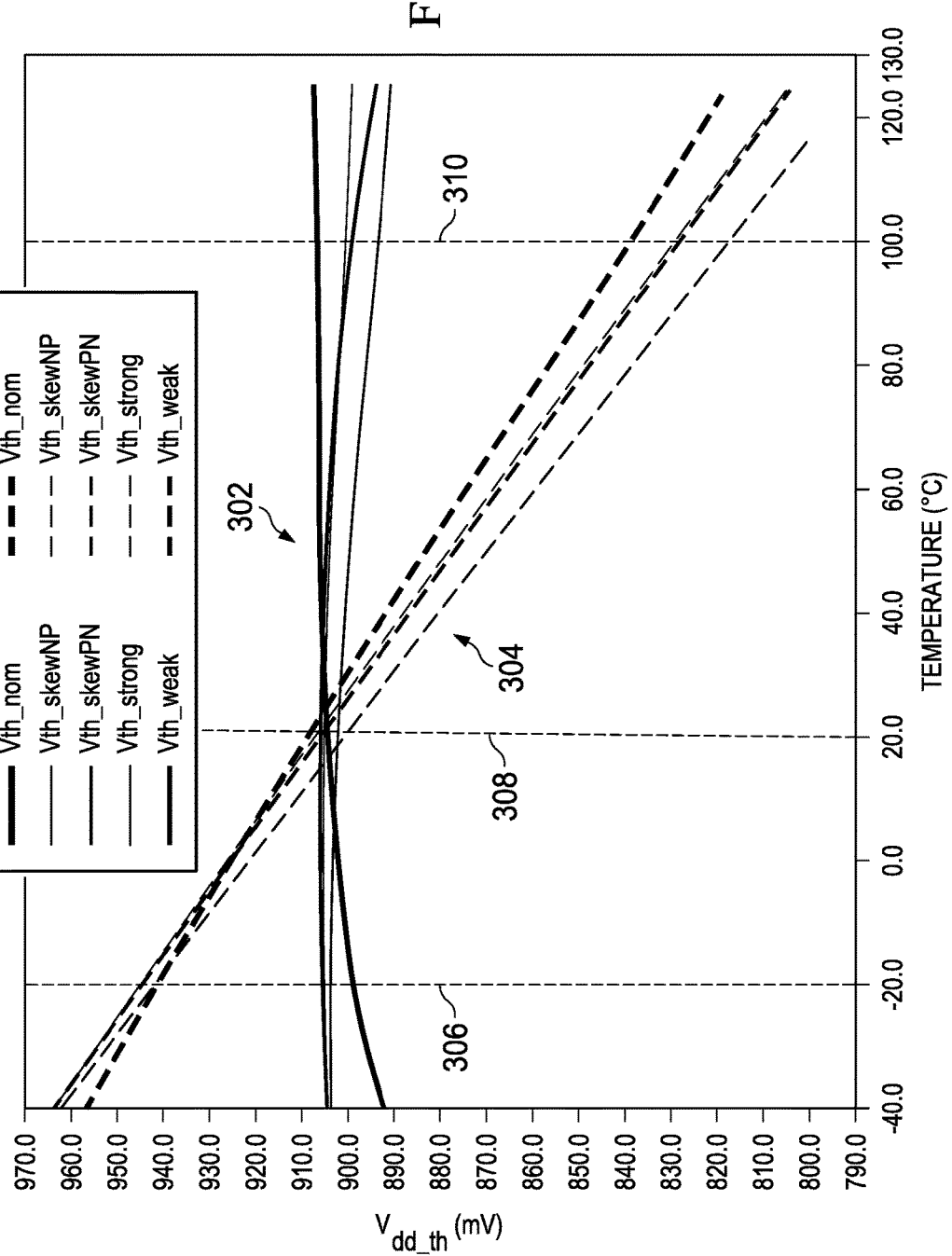
FIG. 3 illustrates a signal plot depicting differences between threshold voltage variation over temperature of the detection circuit of FIG. 2 and a voltage supervisor without the detection circuit.
Figure 5:
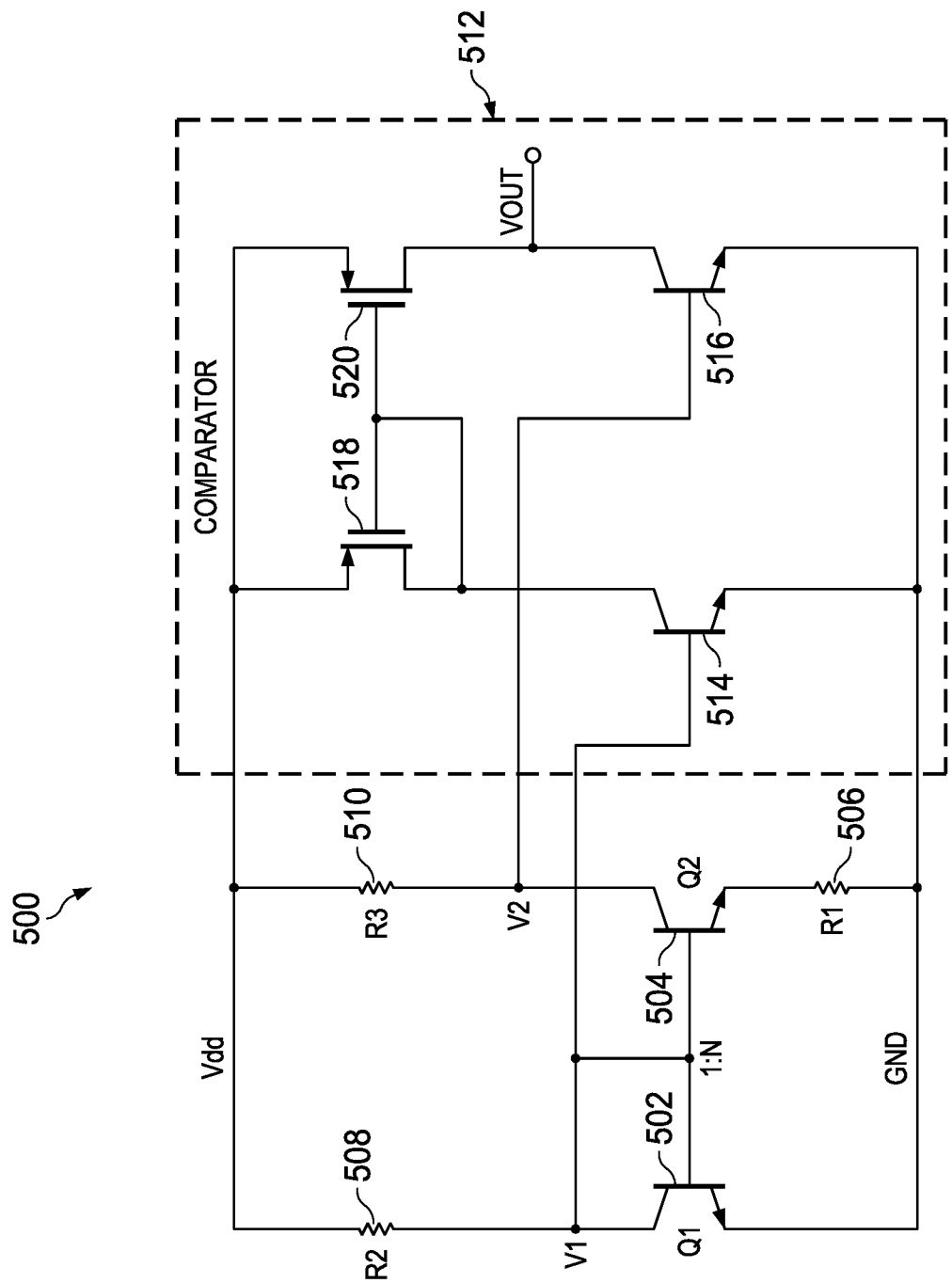
FIG. 5 is a schematic illustration of an example conventional voltage supervisor without the detection circuit.

FIG. 3 illustrates a signal plot 300 depicting threshold voltage variations versus system temperature for voltage supervisors including/not including detection circuit 200. An example of a voltage supervisor that does not include a detection circuit like detection circuit 200 is shown in FIG. 5 as voltage supervisor 500. The signal plot 300 includes a first threshold voltage line 302 and a second threshold voltage line 304. In FIG. 3, the first voltage threshold line 302 may represent the signal (e.g., voltage) at the first node 101 of the detection circuit 200 of FIG. 2 when the supply voltage generator 102 outputs the threshold voltage. In FIG. 3, the second voltage threshold line 304 may represent the signal (e.g., voltage) of supply voltage of a conventional voltage supervisor without the detection circuit 200, such as the voltage supervisor 500 illustrated in FIG. 5, when a supply generator outputs a threshold voltage. In the signal plot 300 of FIG. 3, the threshold voltage is approximately 900 millivolts.

In FIG. 3, there are multiple first threshold voltage lines 302 and multiple second threshold voltage lines 304, where one line (for each plot 302 and 304) is indicative of the ideal/nominal process conditions and the other lines represents a process variations (such as "process corners"). As used herein, a process corner is an example of a design-of-experiments technique that looks at device performance based on device fabrication process deviations where each "corner" represents an extreme deviation in one or more process condition. Process corners represent the extremes of these parameter variations within which a circuit (e.g., voltage supervisors) that has been formed on/over a semiconductor wafer must function correctly. A circuit (e.g., the voltage supervisors) running on devices fabricated at these process corners may run slower or faster than specified and at lower or higher temperatures and voltages.

In FIG. 3, the signal plot 300 includes a range of temperatures from −40° C. to 125° C. (horizontal axis) for the voltage supervisor (one set including the detection circuit 200 and the other not including the detection circuit 200). At a first temperature 306, the detection circuit 200 and the voltage supervisor without the detection circuit 200 are subject to −20° C. (e.g., below the freezing point of water). At the first temperature 306, the first voltage threshold line 302 is indicative of approximately 904 millivolts. For example, the threshold voltage ($V_{dd\_th}$) of the detection circuit 200 is approximately 904 millivolts at −20° C. At the first temperature 306, the second voltage threshold line 304 is indicative of approximately 942 millivolts. For example, the threshold voltage ($V_{dd\_th}$) of the conventional voltage supervisor is approximately 942 millivolts at −20° C. There is a 38 millivolt difference at −20° C. between the detection circuit 200 and the conventional voltage supervisor without the detection circuit 200.

At a second temperature 308, the detection circuit 200 and the conventional voltage supervisor without the detection circuit 200 are subject to 20° C. (e.g., room temperature). At the second temperature 308, the first voltage line 302 is indicative of approximately 900 millivolts. For example, at 20° C., the threshold voltage ($V_{dd\_th}$) of the detection circuit 200 is approximately 900 millivolts, and the second voltage threshold line 304 is approximately 900 millivolts. Hence, the second temperature 308 is an ideal temperature, because it does not cause the devices of the detection circuit 200 and the voltage supervisor without the detection circuit 200 to vary in input and output.

At third temperature 310 (100° C., e.g., boiling point of water), the threshold voltage ($V_{dd\_th}$) of the detection circuit 200 is approximately 903 millivolts, and the threshold voltage ($V_{dd\_th}$) of the conventional voltage supervisor (without the detection circuit 200) is approximately 815 millivolts. Hence, there is an 88 millivolt difference between the threshold voltages of the detection circuit 200 and the conventional voltage supervisor without the detection circuit 200.

Overall, with the temperature range of −40° C. to 125° C., the threshold voltage variation for conventional voltage supervisors without the detection circuit 200 ranges from approximately 800 millivolts to 964 millivolts. Alternatively, over this same temperature range, the threshold voltage variation for the detection circuit 200 is between approximately 891 millivolts and 908 millivolts. Therefore, in examples disclosed herein, the threshold variation over process and temperature is reduced by a factor of approximately 10 (e.g., 164 millivolts reduced to 17 millivolts) for threshold voltages below the bandgap voltage.

Figure 4:
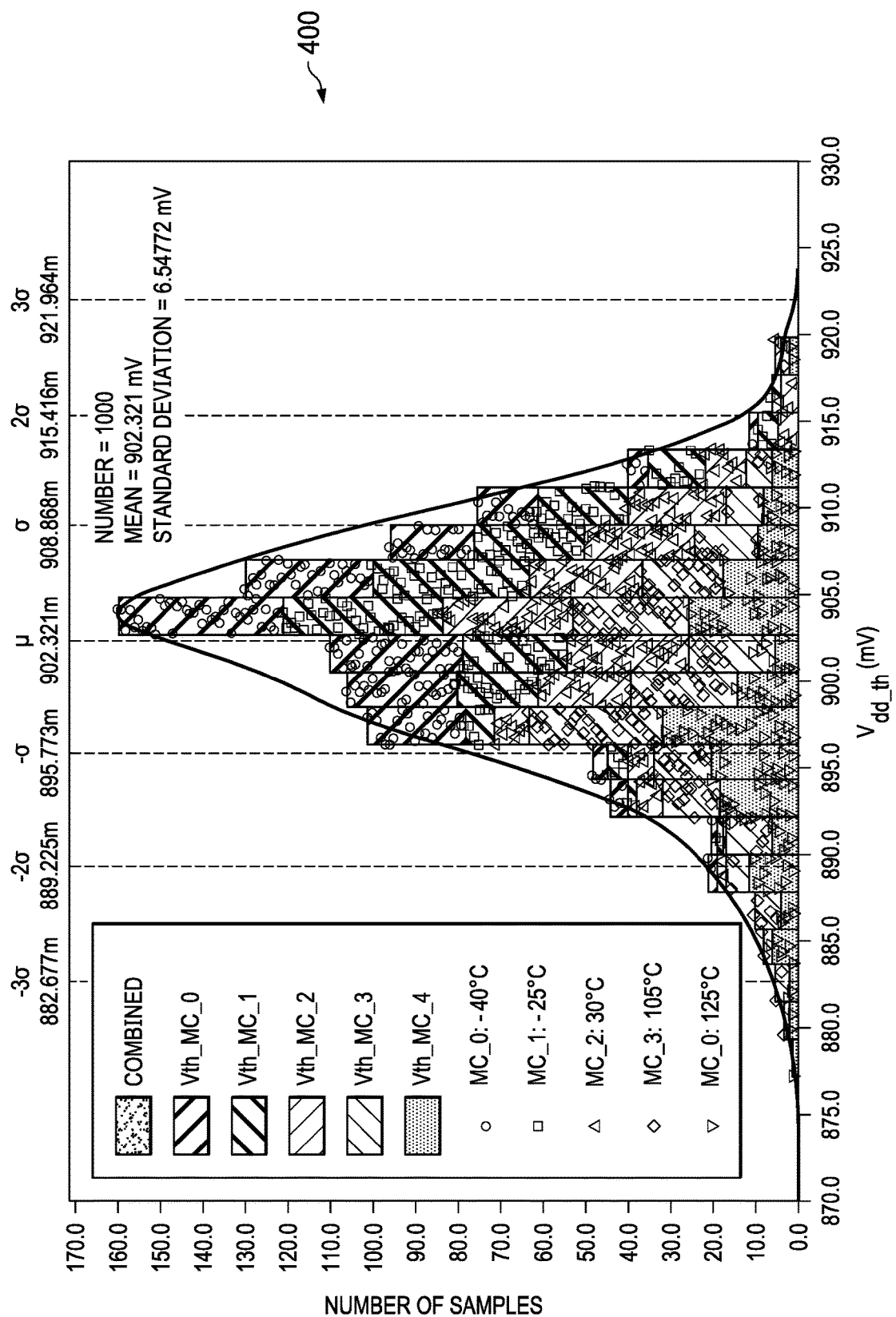
FIG. 4 illustrates a probability distribution graph depicting the threshold voltage of the voltage supervisor of FIG. 2 over five different temperatures.

FIG. 4 illustrates a probability distribution graph 400 depicting the threshold voltage of the detection circuit 200 over five different temperatures. In FIG. 4, the probability distribution graph 400 is a Monte-Carlo simulation, where the detection circuit 200 is sampled multiple times with random process variables. For example, the Monte-Carlo simulation randomly varies the fabrication processes of the components in the detection circuit 200, runs 200 Monte-Carlo simulations at each temperature point, then distributes the threshold voltage of the simulation on the probability distribution graph 400. The detection circuit 200 utilized during the simulations was configured to toggle at 900 millivolts. As such, the threshold voltage ($V_{dd\_th}$) is configured to equal 900 millivolts.

In FIG. 4, the Monte-Carlo simulation runs at five different temperatures and 200 simulations per temperature. In FIG. 4, the probability distribution graph 400 illustrates the threshold voltage ($V_{dd\_th}$) of a first simulation temperature MC_0=−40° C., the threshold voltage ($V_{dd\_th}$) of a second simulation temperature MC_1=−25° C., the threshold voltage ($V_{dd\_th}$) of a third simulation temperature MC_2=30° C., the threshold voltage ($V_{dd\_th}$) of a fourth simulation temperature MC_3=105° C., and the threshold voltage ($V_{dd\_th}$) of a first simulation temperature MC_4=125° C.

Based on the results of all five simulation temperatures, the threshold voltage ($V_{dd\_th}$) of the detection circuit 200 had mean (e.g., average) of approximately 902 millivolts and a standard deviation of approximately 6.5 millivolts over 1000 simulations. In some examples, such a standard deviation is small relative to the amount of mismatch between components randomly configured with different device parameters over the simulations.

FIG. 5 is a schematic illustration of an example voltage supervisor 500, different than the detection circuit 200 of FIG. 2. The voltage supervisor 500 is a conventional voltage supervisor without the detection circuit 200 that monitors supply voltage. The voltage supervisor 500 includes a first BJT transistor 502, a second BJT transistor 504, a first resistor 506, a second resistor 508, a third resistor 510, and a comparator 512. The comparator 512 includes a third BJT transistor 514, a fourth BJT transistor 516, a first MOSFET 518, and a second MOSFET 520.

In FIG. 5, the comparator 512 toggles the output voltage (Vout) when a voltage V1 equals a voltage V2. The voltage V1 and the voltage V2 are inputs to the comparator 512. For example, the third BJT transistor 514 obtains the voltage V1 and the fourth BJT transistor 516 obtains the voltage V2. The toggling point at which the comparator 512 toggles is referred to as the threshold voltage of supply. For example, when a supply voltage (Vdd) charges to a threshold voltage, the comparator 512 toggles.

In FIG. 5, the second BJT transistor 504 is N times the size of the first BJT transistor 502. A base terminal of the first BJT transistor 502 is coupled to a base terminal of the second BJT transistor 504. A collector terminal of the first BJT transistor 502 is coupled to the second resistor 508. A collector terminal of the second BJT transistor 504 is coupled to the third resistor 510 and an emitter terminal of second BJT transistor 504 is coupled to the first resistor 506. The second resistor 508 and the third resistor 510 are equal size resistors. The second and third resistor 508, 510 are coupled to the supply voltage (Vdd).

In FIG. 5, a base terminal of the third BJT transistor 514 of the comparator 512 is coupled between the second resistor 508 and the collector terminal of the first BJT transistor 502. Additionally, the base terminal of the third BJT transistor 514 of the comparator 512 is coupled to the base terminals of the first BJT transistor 502 and the second BJT transistor 504. A base terminal of the fourth BJT transistor 516 of the comparator 512 is coupled between the third resistor 510 and the collector terminal of the first BJT transistor 502. The base terminal of the third BJT transistor 514 receives voltage V1 as an input. The base terminal of the fourth BJT transistor 516 receives voltage V2 as an input.

To determine the toggling point (e.g., the threshold voltage of supply) of the voltage supervisor 500, the threshold voltage is derived based on making the voltage V1 is equal to the voltage at V2. In some examples, the threshold voltage is determined based on Equation 8 below. In Equation 8, $V_{be1}$ is the base to emitter voltage of the first BJT transistor 502 and $\Delta V_{be}$ is the difference between the base to emitter voltage of the first BJT transistor 502 and the base to emitter voltage of the second BJT transistor 504.

$$V_{dd\_th} = \frac{R_2}{R_1} \Delta V_{be} + V_{be1} \quad \text{Equation 8}$$

In some examples, the difference between the base to emitter voltage of the first BJT transistor 502 and the base to emitter voltage of the second BJT transistor 504 ($\Delta V_{be}$) is based on temperature. For example, the difference between the base to emitter voltage of the first BJT transistor 502 and the base to emitter voltage of the second BJT transistor 504 ($\Delta V_{be}$) can be determined utilizing Equations 2 and 3 above. In general, BJT transistors have a negative temperature coefficient, meaning that a BJT becomes less resistive with temperature. Therefore, the temperature coefficient for the first BJT transistor 502 is negative. As such, the base to emitter voltage of the first BJT transistor 502 ($V_{be1}$) decreases with temperature. The difference in base to emitter voltage of the first BJT transistor 502 and the base to emitter voltage of the second BJT transistor 504 ($\Delta V_{be}$) has a positive temperature coefficient, meaning that $\Delta V_{be}$ becomes more resistive with temperature. As such, $\Delta V_{be}$ increases with temperature. The positive temperature coefficient can be designed by choosing the value of N and the resistance of the first resistor 506 and the third resistor 510.

In some examples, $\Delta V_{be}$ and the base to emitter voltage of the first BJT transistor 502 ($V_{be1}$) cancel when the supply voltage (Vdd) is equal to a particular voltage. In some examples, this particular voltage is the bandgap voltage ($V_{BG}$). In this manner, in an operation of the voltage supervisor 500, the comparator 512 toggles when the supply voltage (Vdd) is equal to 1.2 volts. The supply voltage at 1.2 volts is temperature independent and, thus, will not significantly change with temperature. However, in a different operation of the voltage supervisor 500, the comparator 512 is configured to toggle when the supply voltage (Vdd) is above or below the bandgap voltage. In such an operation, the threshold voltage may have a positive or negative temperature coefficient, depending on whether the threshold voltage is greater than or less than the bandgap voltage.

For example, in an operation of the voltage supervisor 500 where the threshold voltage is 2 volts, the comparator 512 toggles responsive to the supply voltage (Vdd) equaling 2 volts. However, at 2 volts, the temperature increases and so does $\Delta V_{be}$, making $\Delta V_{be}$ more positive than the base to emitter voltage of the first BJT transistor 504 ($V_{be1}$). When $\Delta V_{be}$ is more positive than $V_{be1}$, the two voltages (e.g., $\Delta V_{be}$ and $V_{be1}$) do not cancel. As such, the threshold voltage has a positive temperature coefficient. The greater the threshold voltage increases above the bandgap voltage, the greater the temperature coefficient increases.

In another example, in an operation of the voltage supervisor 500 where the threshold voltage is 0.9 volts, the comparator 512 toggles responsive to the supply voltage (Vdd) equaling 0.9 volts. At 0.9 volts, the temperature may be low relative to a greater voltage. At a low temperature, the first BJT transistor 502 becomes more resistive and, thus, the base to emitter voltage of the first BJT transistor 502 increases. Additionally, at the low temperature, the thermal voltage ($V_T$) is low and, thus, $\Delta V_{be}$ may be less than the base to emitter voltage of the first BJT transistor 502 $V_{be1}$. When $\Delta V_{be}$ is less positive than $V_{be1}$, the two voltages (e.g., $\Delta V_{be}$ and $V_{be1}$) do not cancel. As such, the threshold voltage has a negative temperature coefficient. The more the threshold voltage decreases below the bandgap voltage, the more negative the temperature coefficient is.

The voltage supervisor 500 of FIG. 5 is not ideal in situations where the toggling point is configured to be above or below the bandgap voltage. As described above, the threshold voltage is subject to variation when increased above and/or below the bandgap voltage, which can cause inaccurate monitoring of the supply voltage (Vdd). Inaccurate monitoring of the supply voltage (Vdd) can lead to a misrepresentation of the supply voltage (Vdd) and therefore a false indication that the supply voltage is at a level sufficient to operate a load (e.g., such as the digital blocks 104 and/or analog block 106 of FIG. 1). Examples disclosed herein configure the detection circuit 200 to accurately represent the supply voltage for a threshold that is less than the bandgap voltage.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

Example methods, apparatus, systems, and articles of manufacture for temperature insensitive voltage supervisors are disclosed herein. Further examples and combinations thereof include the following:

Example 1 includes an apparatus comprising a proportional to absolute temperature (PTAT) generation circuit including an output, a first resistor having a first terminal and a second terminal, a second resistor having a third terminal and a fourth terminal, the third terminal coupled to the second terminal at a first node, a first transistor including a control terminal coupled to the fourth terminal of the second resistor at a second node, and a first current terminal coupled to the fourth terminal of the second resistor at the second node, a comparator including a first input coupled to the output of the PTAT generation circuit at a third node, a second input coupled to the second terminal and third terminal at the first node, and a third resistor having a fifth terminal coupled to the third terminal and the second input at a fourth node.

Example 2 includes the apparatus of example 1, wherein the first transistor is implemented by a PNP Bipolar Junction Transistor (BJT).

Example 3 includes the apparatus of example 1, wherein the PTAT generation circuit includes an input that is configured to be coupled to a supply voltage generator.

Example 4 includes the apparatus of example 1, wherein the first terminal of the first resistor is configured to be coupled to a supply voltage generator.

Example 5 includes the apparatus of example 1, wherein the PTAT generation circuit further includes a current mirror having a first output current and a second output current, a fourth resistor having a sixth terminal and a seventh terminal, the sixth terminal coupled to the first output current at a fifth node, a second transistor including a second control terminal coupled to the sixth terminal and the first output current at the fifth node, and a second current terminal coupled to the seventh terminal at a sixth node, a third transistor including a third control terminal coupled to the second current terminal and the seventh terminal at the sixth node, a third current terminal coupled to the second output current at a seventh node, a fourth transistor including a fourth control terminal coupled to the sixth terminal and the first output current at the fifth node, a fourth current terminal, and a fifth resistor having an eighth terminal and a ninth terminal, the ninth terminal coupled to the fourth current terminal at the third node.

Example 6 includes the apparatus of example 5, wherein the second transistor, the third transistor, and the fourth transistor are implemented by PNP BJTs.

Example 7 includes the apparatus of example 5, wherein the first resistor and the fifth resistor are configured to have equal resistance values.

Example 8 includes the apparatus of example 5, wherein the current mirror includes a first switch including a first switch control terminal, a first switch current terminal configured to be coupled to a supply voltage generator, and a second switch current terminal coupled to the sixth terminal at the fifth node, and a second switch including a second switch control terminal coupled to the first switch control terminal at an eighth node, a third switch current terminal configured to be coupled to a supply voltage generator, and a fourth switch current terminal coupled to the third current terminal of the third transistor at the seventh node and the second switch control terminal at the eighth node.

Example 9 includes the apparatus of example 8, wherein the first switch and the second switch are implemented by P-channel metal-oxide-semiconductor field-effect transistors (MOSFETs).

Example 10 includes a system comprising a voltage supervisor including a detection circuit configured to be coupled to a supply voltage, the detection circuit including, a comparator having an output terminal that is configured to toggle at a threshold voltage, and a circuit block including a circuit block input terminal coupled to the output terminal, the circuit block to operate at the threshold voltage, wherein the threshold voltage less than a bandgap voltage.

Example 11 includes the system of example 10, wherein the detection circuit further includes a proportional to absolute temperature (PTAT) generation circuit having an input terminal that is configured to be coupled to a supply voltage generator.

Example 12 includes the system of example 11, wherein the PTAT generation circuit further includes a current mirror having a first output current terminal and a second output current terminal, a first resistor having a first terminal and a second terminal, the first terminal coupled to the first output current terminal at a first node, a first transistor including a first base terminal coupled to the first terminal of the first resistor and the first output current terminal of the current mirror at the first node, and a first current terminal coupled to the second terminal of the first resistor at a second node, a second transistor including a second base terminal coupled to the first current terminal of the first transistor and the second terminal of the first resistor at the second node, a second current terminal coupled to the second output current terminal of the current mirror at a third node, a third transistor including a third base terminal coupled to the first terminal of the first resistor and the first output current terminal of the current mirror at the first node, a third current terminal, and a second resistor having a third terminal and a fourth terminal, the third terminal coupled to the third current terminal of the third transistor at the third node.

Example 13 includes the system of example 12, wherein the first transistor, the second transistor, and the third transistor are implemented by PNP BJTs.

Example 14 includes the system of example 10, wherein the detection circuit further includes a first resistor coupled to a first input terminal of the comparator, and a second resistor having an equal size as the first resistor, the second resistor coupled to a second input terminal of the comparator.

Example 15 includes the system of example 10, wherein the detection circuit further includes a transistor including a current terminal, and a base terminal coupled to the current terminal at a first node, a first resistor including a first resistor terminal coupled to an input terminal of the comparator, and a second resistor terminal coupled to the current terminal of the transistor at the first node, and a second resistor including a third resistor terminal coupled to the input terminal of the comparator.

Example 16 includes the system of example 10, wherein the circuit block is an analog block or a digital block.

Example 17 includes a method comprising generating a first current that is proportional to absolute temperature (PTAT) responsive to a supply voltage applied to an input terminal of a PTAT generation circuit, mirroring the first current at a first resistor, in response to a supply voltage equaling a threshold voltage, the threshold voltage less than a bandgap voltage generating a second current across a second resistor that is equal to or proportional to the first current across the first resistor, and comparing a first voltage at a first node connected to the first resistor and a second voltage at a second node connected to the second resistor.

Example 18 includes the method of example 17, further including toggling an output responsive to comparing the first voltage to the second voltage when the supply voltage equals the threshold voltage.

Example 19 includes the method of example 17, wherein the first voltage and the second voltage are equal at the threshold voltage, the threshold voltage insensitive to temperature variation.

Example 20 includes the method of example 17, wherein the comparing of the first voltage to the second voltage at the threshold voltage includes comparing the supply voltage minus a first voltage drop of the first resistor to the supply voltage minus a second voltage drop of the second resistor.

Example 21 includes the method of example 17, wherein the supply voltage is a low voltage supply, the method further including generating the first current responsive to the low voltage supply and quick changes in the low voltage supply.

From the foregoing, it will be appreciated that example methods, apparatus and articles of manufacture have been disclosed that generate temperature insensitive threshold voltages for voltage supervisors that require threshold voltages below the bandgap voltage. Examples disclosed herein include a low-voltage PTAT generation circuit to generate PTAT current that causes a first resistor, coupled to the supply voltage, to drop a constant voltage that is proportional to absolute temperature. Examples disclosed herein include a second resistor coupled to the supply voltage that is equal to the first resistor and, thus, drops a voltage equal to the voltage drop of the first resistor when the supply voltage meets a threshold.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent. The following claims are hereby incorporated into this Detailed Description by this reference, with each claim standing on its own as a separate embodiment of the present disclosure.

What is claimed is:

1. An apparatus comprising:
a proportional to absolute temperature (PTAT) generation circuit including an output;
a first resistor having a first terminal and a second terminal;
a second resistor having a third terminal and a fourth terminal, the third terminal coupled to the second terminal at a first node;
a first transistor including:
a control terminal coupled to the fourth terminal of the second resistor at a second node; and
a first current terminal coupled to the fourth terminal of the second resistor at the second node;
a comparator including:
a first input coupled to the output of the PTAT generation circuit at a third node; and
a second input coupled to the second terminal and third terminal at the first node; and
a third resistor having a fifth terminal coupled to the third terminal and the second input at a fourth node.

2. The apparatus of claim 1, wherein the first transistor is implemented by a PNP Bipolar Junction Transistor (BJT).

3. The apparatus of claim 1, wherein the PTAT generation circuit includes an input that is configured to be coupled to a supply voltage generator.

4. The apparatus of claim 1, wherein the first terminal of the first resistor is configured to be coupled to a supply voltage generator.

5. An apparatus comprising:
a proportional to absolute temperature (PTAT) generation circuit including an output;
a first resistor having a first terminal and a second terminal;
a second resistor having a third terminal and a fourth terminal, the third terminal coupled to the second terminal at a first node;
a first transistor including:
a control terminal coupled to the fourth terminal of the second resistor at a second node; and
a first current terminal coupled to the fourth terminal of the second resistor at the second node;
a comparator including:
a first input coupled to the output of the PTAT generation circuit at a third node; and
a second input coupled to the second terminal and third terminal at the first node;
a third resistor having a fifth terminal coupled to the third terminal and the second input at a fourth node; and
wherein the PTAT generation circuit further includes:
a current mirror having a first output current and a second output current;
a fourth resistor having a sixth terminal and a seventh terminal, the sixth terminal coupled to the first output current at a fifth node;
a second transistor including:
a second control terminal coupled to the sixth terminal and the first output current at the fifth node; and
a second current terminal coupled to the seventh terminal at a sixth node;
a third transistor including:
a third control terminal coupled to the second current terminal and the seventh terminal at the sixth node;
a third current terminal coupled to the second output current at a seventh node;
a fourth transistor including:
a fourth control terminal coupled to the sixth terminal and the first output current at the fifth node;
a fourth current terminal; and
a fifth resistor having an eighth terminal and a ninth terminal, the ninth terminal coupled to the fourth current terminal at the third node.

6. The apparatus of claim 5, wherein the second transistor, the third transistor, and the fourth transistor are implemented by PNP BJTs.

7. The apparatus of claim 5, wherein the first resistor and the fifth resistor are configured to have equal resistance values.

8. The apparatus of claim 5, wherein the current mirror includes:
a first switch including:
a first switch control terminal;
a first switch current terminal configured to be coupled to a supply voltage generator; and a second switch current terminal coupled to the sixth terminal at the fifth node; and a second switch including:
a second switch control terminal coupled to the first switch control terminal at an eighth node;
a third switch current terminal configured to be coupled to a supply voltage generator; and
a fourth switch current terminal coupled to the third current terminal of the third transistor at the seventh node and the second switch control terminal at the eighth node.

9. The apparatus of claim 8, wherein the first switch and the second switch are implemented by P-channel metal-oxide-semiconductor field-effect transistors (MOSFETs).

10. A system comprising:
a voltage supervisor including:
a detection circuit configured to be coupled to a supply voltage, the detection circuit including:
a proportional to absolute temperature (PTAT) generation circuit including:
a first transistor having a first control terminal and a first current path coupled between a supply threshold voltage and ground;
a second transistor having a second control terminal coupled to the first current path and a second current path coupled between the supply threshold voltage and ground;
a third transistor having a third control terminal coupled to the first control terminal and a third current path coupled between the supply threshold voltage and ground; and
a current mirror coupled between the first and second transistor and the supply threshold voltage;
a comparator coupled to the PTAT generation circuit and having an output that is configured to toggle at a threshold voltage; and
a circuit block including a circuit block input terminal coupled to the output terminal, the circuit block to operate at the threshold voltage, wherein the threshold voltage is less than a bandgap voltage.

11. The system of claim 10, wherein the detection circuit further includes:
a first resistor coupled to a first input terminal of the comparator; and
a second resistor having an equal size as the first resistor, the second resistor coupled to a second input terminal of the comparator.

12. The system of claim 10, wherein the detection circuit further includes:
a transistor including:
a current terminal; and
a base terminal coupled to the current terminal at a first node;
a first resistor including:
a first resistor terminal coupled to an input terminal of the comparator; and a second resistor terminal coupled to the current terminal of the transistor at the first node; and
a second resistor including a third resistor terminal coupled to the input terminal of the comparator.

13. The system of claim 10, wherein the circuit block is an analog block or a digital block.

14. A system comprising:
a voltage supervisor including:
a detection circuit configured to be coupled to a supply voltage, the detection circuit including:
a proportional to absolute temperature (PTAT) generation circuit having an input terminal that is configured to be coupled to a supply voltage generator, the PTAT generation circuit further includes:
a current mirror having a first output current terminal and a second output current terminal;
a first resistor having a first terminal and a second terminal, the first terminal coupled to the first output current terminal at a first node;
a first transistor including:
a first base terminal coupled to the first terminal of the first resistor and the first output current terminal of the current mirror at the first node; and
a first current terminal coupled to the second terminal of the first resistor at a second node;
a second transistor including:
a second base terminal coupled to the first current terminal of the first transistor and the second terminal of the first resistor at the second node; and
a second current terminal coupled to the second output current terminal of the current mirror at a third node;
a third transistor including:
a third base terminal coupled to the first terminal of the first resistor and the first output current terminal of the current mirror at the first node;
a third current terminal; and
a second resistor having a third terminal and a fourth terminal, the third terminal coupled to the third current terminal of the third transistor at the third node; and
a comparator having an output terminal that is configured to toggle at a threshold voltage; and
a circuit block including a circuit block input terminal coupled to the output terminal, the circuit block to operate at the threshold voltage, wherein the threshold voltage less than a bandgap voltage.

15. The system of claim 14, wherein the first transistor, the second transistor, and the third transistor are implemented by PNP BJTs.

* * * * *